(12) United States Patent
Kaixie et al.

(10) Patent No.: US 8,318,042 B2
(45) Date of Patent: Nov. 27, 2012

(54) SYSTEMS, METHODS AND SOLUTIONS FOR CHEMICAL POLISHING OF GAAS WAFERS

(75) Inventors: Tan Kaixie, San Francisco, CA (US); Gu Yan, Beijang (CN); Wang Yuanli, Beijing (CN)

(73) Assignee: AXT Inc., Fremont, CA (US)

( * ) Notice: Subject to any disclaimer, the term of this patent is extended or adjusted under 35 U.S.C. 154(b) by 421 days.

(21) Appl. No.: 12/569,870

(22) Filed: Sep. 29, 2009

(65) Prior Publication Data
US 2010/0176336 A1    Jul. 15, 2010

(30) Foreign Application Priority Data

Jan. 15, 2009    (CN) .......................... 2009 1 0001587

(51) Int. Cl.
*C09K 13/00*    (2006.01)
*H01L 21/302*    (2006.01)
*H01L 21/461*    (2006.01)
*H01L 21/306*    (2006.01)

(52) U.S. Cl. .................. 252/79.1; 438/692; 156/345.12
(58) Field of Classification Search .................. None
See application file for complete search history.

(56) References Cited

U.S. PATENT DOCUMENTS

| 7,267,604 B2 | 9/2007 | Yoshizawa et al. | |
|---|---|---|---|
| 2006/0292728 A1* | 12/2006 | Ishibashi et al. | 438/30 |
| 2007/0200089 A1* | 8/2007 | Inaba et al. | 252/79.1 |
| 2008/0029126 A1* | 2/2008 | Thomas | 134/2 |
| 2008/0194182 A1 | 8/2008 | Nakayama et al. | |
| 2008/0206995 A1* | 8/2008 | Tomiga et al. | 438/693 |

FOREIGN PATENT DOCUMENTS

| JP | 11283943 | 10/1999 |
|---|---|---|
| JP | 2002018705 | 1/2002 |
| JP | 2005264057 | 9/2005 |

* cited by examiner

*Primary Examiner* — Shamim Ahmed
*Assistant Examiner* — Bradford Gates
(74) *Attorney, Agent, or Firm* — Alston & Bird LLP

(57) ABSTRACT

Chemical polishing solutions and methods are disclosed for the chemical polishing of GaAs wafers. An exemplary chemical polishing solution consistent with the innovations herein may comprise dichloroisocyanurate, sulfonate, acid pyrophosphate, bicarbonate and carbonate. An exemplary chemical polishing method may comprise polishing a wafer in a chemical polishing apparatus in the presence of such a chemical polishing solution. Chemical polishing solutions and methods herein make it possible, for example, to improve wafer quality, decrease costs, and/or reduce environmental pollution.

20 Claims, 2 Drawing Sheets

SYSTEMS, METHODS AND SOLUTIONS FOR CHEMICAL POLISHING OF GAAS WAFERS

CROSS-REFERENCE TO RELATED APPLICATIONS

This application is based upon and claims benefit/priority of prior Chinese patent application No. 200910001587.7, filed Jan. 15, 2009, published as CN 101781526A the disclosure of which is hereby incorporated by reference in its entirety for all purposes.

BACKGROUND

1. Field

The present disclosure relates to chemical polishing solutions and chemical polishing methods using the chemical polishing solutions for gallium arsenide (GaAs) wafers.

2. Description of Related Information

GaAs is an important semiconductor material, developed more recently than Ge and Si to meet performance demands in semiconducting and semi-insulating devices. In certain applications and fields, GaAs crystals perform better than Ge and Si. For example, GaAs has an electron mobility about 6 times higher and can operate at higher frequencies than Si, and is thus a good material for high-speed integrated circuits and electronic devices. Monocrystalline GaAs wafers are mainly used in microwave and mm-wave communication fields, such as mobile phone, satellite transmission broadcast, radar system and other related areas of advanced electronics. Owing to its excellent photoelectric properties, GaAs is also used extensively in laser devices and light emission diode (LED) applications. Developments in these technologies coupled with the expanding use of monocrystalline GaAs has fostered a rapid increase in demand for GaAs products of higher quality and lower cost. GaAs manufacturers have made efforts to improve product quality and reduce cost, including attempts to reduce adverse environmental impacts such as pollution stemming from chlorine ($Cl_2$) volatilization of wafer polishing solutions.

In general, GaAs wafers are cut from a GaAs crystal ingot by a metal saw or a wire saw, which then undergo further processing, including grinding, chemical mechanical polishing, chemical polishing, and special cleaning before being packaged for delivery. The processed GaAs crystal wafers have smooth, mirror-like main surfaces. Consumers of these processed GaAs crystals typically add different monocrystalline layers of various thicknesses onto the surface to provide devices with different functions.

During the chemical mechanical polishing and chemical polishing processes, polishing solutions are used, which are referred to as "chemical polishing solutions." The existing chemical polishing solutions often leave the GaAs crystal wafers contaminated with metal ions. Accordingly, electrical devices prepared using these wafers may suffer a variety of drawbacks and defects such as increased leakage current, reduced service life, and failures, and the like. As such, there is a need in the art for improved chemical polishing solutions that enable creation of GaAs crystal wafers of high quality, while minimizing production costs, pollution and/or related problems.

SUMMARY

Systems, solutions and methods consistent with the disclosure are directed to chemical polishing of GaAs wafers.

In one exemplary implementation, there is provided chemical polishing solutions for chemical polishing gallium arsenide (GaAs) wafers comprising, an alkali metal dichloroisocyanurate or ammonium dichloroisocyanurate, an alkali metal acid pyrophosphate or ammonium pyrophosphate, an alkali metal carbonate or ammonium carbonate, an alkali metal bicarbonate or ammonium bicarbonate, an alkali metal sulfonate or ammonium sulfonate, and optionally one or more solvents.

In another exemplary implementation, there is provided chemical polishing methods for performing chemical polishing of a gallium arsenide (GaAs) crystal wafer, comprising the steps of polishing the wafer in a chemical polishing apparatus in the presence of the chemical polishing solution comprising, an alkali metal dichloroisocyanurate or ammonium dichloroisocyanurate, an alkali metal acid pyrophosphate or ammonium pyrophosphate, an alkali metal carbonate or ammonium carbonate, an alkali metal bicarbonate or ammonium bicarbonate, an alkali metal sulfonate or ammonium sulfonate, and optionally one or more solvents.

It is to be understood that both the foregoing summary and the following detailed description are exemplary and explanatory only and are not restrictive of the disclosure. Further features and/or variations may be provided in addition to those set forth herein. For example, the present disclosure may be directed to various combinations and subcombinations of the disclosed features and/or combinations and subcombinations of several further features disclosed below in the detailed description.

DESCRIPTION OF THE DRAWINGS

The accompanying drawings, which constitute a part of this specification, illustrate various implementations and aspects of the present disclosure and, together with the description, explain the principles. In the drawings.

DETAILED DESCRIPTION OF EXEMPLARY IMPLEMENTATIONS

Figure 1:
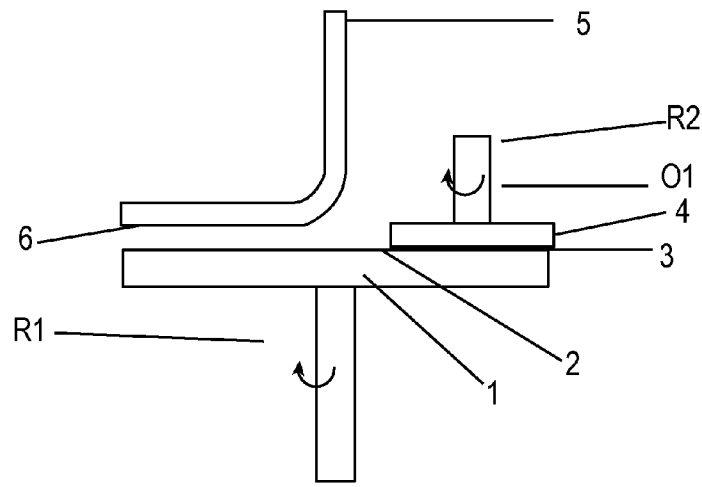
FIG. 1 illustrates a schematic cross-sectional view of a chemical polishing apparatus, consistent with certain aspects of the innovations herein.

Reference will now be made in detail to the examples which are illustrated in the accompanying drawings. The implementations set forth in the following description do not represent all implementations consistent with the disclosure. Instead, they are merely some examples consistent with certain aspects related to the disclosure. Wherever possible, the same reference numbers will be used throughout the drawings to refer to the same or like parts.

In one aspect the disclosure provides a chemical polishing solution for chemical polishing gallium arsenide (GaAs) wafers having an alkali metal dichloroisocyanurate or ammonium dichloroisocyanurate, an alkali metal acid pyrophosphate or ammonium pyrophosphate, an alkali metal carbonate or ammonium carbonate, an alkali metal bicarbonate or ammonium bicarbonate, an alkali metal sulfonate or ammonium sulfonate, and optionally one or more solvents.

In another aspect the disclosure provides a chemical polishing solution having from about 25 to about 40% of an alkali metal dichloroisocyanurate or ammonium dichloroisocyanurate, from about 15 to about 40% of an alkali metal acid pyrophosphate or ammonium pyrophosphate, from about 10 to about 30% of an alkali metal carbonate or ammonium carbonate, from about 15 to about 26% of an alkali metal bicarbonate or ammonium bicarbonate, and from about 0.1 to about 1% of an alkali metal sulfonate or ammonium sulfonate, based on a total weight of 100%, excluding the one or more solvents.

In another aspect the disclosure provides a chemical polishing solution having from about 28 to about 37% of an alkali metal dichloroisocyanurate or ammonium dichloroisocyanurate, from about 18 to about 37% of an alkali metal acid pyrophosphate or ammonium pyrophosphate, from about 13 to about 27% of an alkali metal carbonate or ammonium carbonate, from about 17 to about 23% of an alkali metal bicarbonate or ammonium bicarbonate, and from about 0.2 to about 0.7% of an alkali metal sulfonate or ammonium sulfonate, based on a total weight of 100%, excluding the one or more solvents.

In another aspect the disclosure provides a chemical polishing solution having from about 30 to about 36% of an alkali metal dichloroisocyanurate or ammonium dichloroisocyanurate, from about 24 to about 35% of an alkali metal acid pyrophosphate or ammonium pyrophosphate, from about 15 to about 22% of an alkali metal carbonate or ammonium carbonate, from about 18 to about 21% of an alkali metal bicarbonate or ammonium bicarbonate, and from about 0.3 to about 0.4% of an alkali metal sulfonate or ammonium sulfonate, based on a total weight of 100%, excluding the one or more solvents.

In another aspect the disclosure provides a chemical polishing solution having an alkali metal dichloroisocyanurate or ammonium dichloroisocyanurate, an alkali metal acid pyrophosphate or ammonium pyrophosphate, an alkali metal carbonate or ammonium carbonate, an alkali metal bicarbonate or ammonium bicarbonate, an alkali metal sulfonate or ammonium sulfonate, and optionally one or more solvents, wherein the total percentage by weight of the alkali metal dichloroisocyanurate or ammonium dichloroisocyanurate, the alkali metal acid pyrophosphate or ammonium pyrophosphate, the alkali metal carbonate or ammonium carbonate, the alkali metal bicarbonate or ammonium bicarbonate, and the alkali metal sulfonate or ammonium sulfonate, is not higher than about 2% of the total weight of the solution.

In another aspect the disclosure provides a chemical polishing solution having an alkali metal dichloroisocyanurate or ammonium dichloroisocyanurate, an alkali metal acid pyrophosphate or ammonium pyrophosphate, an alkali metal carbonate or ammonium carbonate, an alkali metal bicarbonate or ammonium bicarbonate, an alkali metal sulfonate or ammonium sulfonate, and optionally one or more solvents, wherein the alkali metal dichloroisocyanurate is sodium dichloroisocyanurate or potassium dichloroisocyanurate, the alkali metal acid pyrophosphate is sodium acid pyrophosphate or potassium acid pyrophosphate, the alkali metal carbonate is sodium carbonate or potassium carbonate, the alkali metal bicarbonate is sodium bicarbonate or potassium carbonate, and the alkali metal sulfonate is sodium sulfonate or potassium sulfonate.

In another aspect the disclosure provides a chemical polishing solution having an alkali metal dichloroisocyanurate or ammonium dichloroisocyanurate, an alkali metal acid pyrophosphate or ammonium pyrophosphate, an alkali metal carbonate or ammonium carbonate, an alkali metal bicarbonate or ammonium bicarbonate, an alkali metal sulfonate or ammonium sulfonate, and optionally one or more solvents, wherein the alkali metal dichloroisocyanurate is sodium dichloroisocyanurate, the alkali metal acid pyrophosphate is sodium acid pyrophosphate, the alkali metal carbonate is sodium carbonate, the alkali metal bicarbonate is sodium bicarbonate, and the alkali metal sulfonate is sodium sulfonate.

In another aspect the disclosure provides a chemical polishing solution for chemical polishing gallium arsenide (GaAs) wafers having an alkali metal dichloroisocyanurate or ammonium dichloroisocyanurate, an alkali metal acid pyrophosphate or ammonium pyrophosphate, an alkali metal carbonate or ammonium carbonate, an alkali metal bicarbonate or ammonium bicarbonate, an alkali metal sulfonate or ammonium sulfonate, and optionally one or more solvents, wherein the one or more solvents is an aqueous solvent, an alcoholic solvent, ketone solvent, ether solvent or a halogenated solvent.

In another aspect the disclosure provides a chemical polishing solution for chemical polishing gallium arsenide (GaAs) wafers having an alkali metal dichloroisocyanurate or ammonium dichloroisocyanurate, an alkali metal acid pyrophosphate or ammonium pyrophosphate, an alkali metal carbonate or ammonium carbonate, an alkali metal bicarbonate or ammonium bicarbonate, an alkali metal sulfonate or ammonium sulfonate, and optionally one or more solvents is water.

In another aspect the disclosure provides a chemical polishing method for performing chemical polishing of a gallium arsenide (GaAs) crystal wafer, comprising the steps of polishing the wafer in a chemical polishing apparatus in the presence of the chemical polishing solution having an alkali metal dichloroisocyanurate or ammonium dichloroisocyanurate, an alkali metal acid pyrophosphate or ammonium pyrophosphate, an alkali metal carbonate or ammonium carbonate, an alkali metal bicarbonate or ammonium bicarbonate, an alkali metal sulfonate or ammonium sulfonate, and optionally one or more solvents.

In one implementation, the chemical polishing solution for chemical polishing of GaAs wafers, may comprise dichloroisocyanurate, sulfonate, acid pyrophosphate, bicarbonate and carbonate, excluding the solvent (aqueous solvent/water).

In another implementation, the disclosed chemical polishing solutions may comprise, based on weight, about 29 to about 40% dichloroisocyanurate, about 0.20 to about 0.45% sulfonate, about 18 to about 35% acid pyrophosphate, about 17 to about 24% bicarbonate, and about 15 to about 23% carbonate, by weight based on the solute, excluding aqueous solvent (water).

The percentage values herein are expressed "by weight based on the solute, excluding the aqueous solvent," meaning that the numerical values refer to the quantity of substance dissolved in the water/solvent.

In another implementation, the disclosed chemical polishing solutions may comprise about 31 to about 37% dichloroisocyanurate, about 0.28 to about 0.42% sulfonate, about 20 to about 32.3% acid pyrophosphate, about 17.5 to about 22% bicarbonate, and about 16 to about 23.00% carbonate, by weight based on the solute, excluding aqueous solvent/water.

In another implementation, the disclosed chemical polishing solutions may comprise about 32 to about 36% dichloroisocyanurate, about 0.3 to about 0.4% sulfonate, about 23 to about 30% acid pyrophosphate, about 17.5 to about 22% bicarbonate, and about 17 to about 22% carbonate, by weight based on the solute, excluding aqueous solvent/water.

In the disclosed chemical polishing solutions, the total percentages by weight of dichloroisocyanurate, sulfonate, acid pyrophosphate, bicarbonate and carbonate, not considering solvent/water, may be 100%. To the extent that it has no negative effects on GaAs wafers, the total percentage by weight of the chemical components (i.e. dichloroisocyanurate, sulfonate, acid pyrophosphate, bicarbonate and carbonate), after having been dissolved in solvent/water, is not limited and may be of various percentages, although values not higher than about 3%, not higher than about 2.5%, not higher than about 2%, and also not higher than about 1.8% are consistent with the disclosure.

For the purpose of preparing chemical polishing solutions, dichloroisocyanurate, acid pyrophosphate, bicarbonate and carbonate may be any one of their water-soluble salts, respectively. Further, dichloroisocyanurate, acid pyrophosphate, bicarbonate and carbonate may be any one of their water-soluble alkali metal salts or ammonium salts, respectively, and/or any one of their sodium salts or ammonium salts.

In some of the disclosed chemical polishing solutions, sulfonate may be any one of water-soluble sulfonates, a water-soluble alkali metal or ammonium sulfonate, or a sodium or ammonium sulfonate. Further, sulfonate may be bisulfonate or monosulfonate of a $C_{6-16}$aryl group (i.e. an aromatic group containing 6 to 16 carbon atoms, including substituted phenyl) (such as $C_{4-10}$alkylbenzene sulfonate, benzene sulfonate, naphthalene sulfonate, anthracene sulfonate, $C_{4-10}$alkylbenzene disulfonate bi-salt, benzene disulfonate bi-salt, naphthalene di-sulfonate bi-salt or anthracene di-sulfonate bi-salt, for example, 1,2-benzenedisulfonic bi-salt, 1,3-benzenedisulfonic bi-salt, benzene sulfonate or naphthalene sulfonate), alkyl sulfonate such as a sulfonate of an alkyl group of 4 to 10 carbon atoms, including butyl sulfonate, pentyl sulfonate, hexyl sulfonate, heptyl sulfonate, octyl sulfonate, nonyl sulfonate and decyl sulfonate) and phenolic sulfonate, or sulfonate may be 1,3-benzenedisulfonic, benzene sulfonate, naphthalene sulfonate or hexyl sulfonate.

For the preparation of the disclosed chemical polishing solutions, all of the chemical components may be directly introduced into, and dissolved in deionized water, and uniformly mixed. The chemical components may also be mixed thoroughly, introduced into and dissolved in deionized water, and uniformly mixed. Alternatively, the chemical components may be introduced, one after another, into deionized water, dissolved therein, and uniformly mixed.

As shown by analysis and testing, when the disclosed chemical polishing solutions are stored in a sealed container, the chlorine ($Cl_2$) gas that vaporizes from the solution into the space air of the container is not higher than 55.3 ml/m$^3$. Thus, it may be concluded that, compared with existing solutions, the disclosed chemical polishing solutions may decrease the vaporizing $Cl_2$ concentration in the air space of a container and reduce the environment pollution.

Surprisingly, further analysis and test results show that the disclosed chemical polishing solutions may be used after being stored for 24 hours after their preparation without compromising their effectiveness. Accordingly, the disclosed chemical polishing solutions may not require 'on the spot' preparation; instead, they may be prepared beforehand and stored as stock solution. Thus, the disclosed chemical polishing solutions allow for longer timeframes for their preparation and use.

The disclosed chemical polishing solutions make it possible to achieve excellent polishing quality of a GaAs wafer at low concentrations. For example, based on the total weight of the chemical polishing solution, the total percentage of all of the chemical components is not higher than about 1.8%. Thus, reduced amounts of the chemical components may be used, resulting in less crystallization of the chemical components in the chemical polishing solution and further contributing to reduced damages and scratches on the GaAs wafers, whereby production rates are increased.

Also, it is unexpectedly found that the disclosed chemical polishing solutions contribute to a substantially reduced content of contaminating metal ions on the polished wafers, and thus avoid any negative effect of the metal ions on the wafer surfaces. This facilitates enhancing the quality of the extended layers of the devices deposited on the wafers. Indeed, TXRF (x-ray reflection fluorescence test) shows that by employing the disclosed chemical polishing solutions, there is no Cu identified on the polished GaAS wafer surface. Regarding existing chemical polishing solutions, it is difficult to avoid Cu contamination on the polished wafer surface. Without being limited to any theory, it is believed that Cu present on the polished wafer surface is attributable to the colloidal silica contained in previous chemical polishing solutions as $SiO_2$, which entrains metal ions and other impurities.

Additional tests show that, with colloidal silica introduced into it, the disclosed chemical polishing solutions may be used in chemical-mechanical rough polishing processes, a process that may be conducted before the chemical polishing processes discussed herein.

Consistent with the innovations herein, chemical polishing methods for performing chemical polishing of GaAs crystal wafers comprise polishing said wafer in a double-sided or single-sided chemical polishing apparatus in the presence of a chemical polishing solution comprising, excluding solvent/water, dichloroisocyanurate, sulfonate, acid pyrophosphate, bicarbonate and carbonate.

In another implementation of the disclosed chemical polishing solutions, the total percentage by weight of the chemical components in water may be: not higher than about 3%, not higher than about 2.5%, not higher than about 2%, or not higher than about 1.8%.

The disclosed chemical polishing solutions described herein, may be used in the chemical polishing methods for GaAs wafers. The contents of the components described in connection with the disclosed chemical polishing solutions may be combined with each other to constitute differing aspects of the chemical polishing solutions and methods, respectively.

As exemplified in FIG. 1, a representative chemical polishing method may be implemented as follows. A GaAs wafer 3 to be polished is loaded into a single-sided polishing equipment. The polishing equipment includes two parts, one above the other: the lower polishing plate 1 and the polishing head 4, with the lower polishing plate 1 lined with a polishing pad 2. GaAs wafer 3 is placed between the polishing head 4 and the polishing pad 2. Parts 1 and 4 are rotated by driving shafts R1 and R2. For the purpose of carrying out the polishing process, the chemical polishing solution is supplied by a pipe 5, dripping to the polishing pad 2 through dripping holes 6; pipe 5 includes a horizontal section that is closed at its end and provided at its lower side with several evenly distributed dripping holes 6 of desired diameter, e.g. 3 mm, etc. After being polished for a pre-determined time, the GaAs wafer is taken out from the polishing equipment, and then cleaned and dried, to provide the final product.

The disclosed chemical polishing methods may be applied to any product that has undergone a chemical-mechanical rough polishing method. The chemical polishing method may be carried out after a chemical-mechanical rough polishing is performed using a different polishing solution. For example, before the disclosed chemical polishing method is carried out, a chemical-mechanical rough polishing method may first be performed. Here, such rough polishing may be carried out with a chemical-mechanical rough polishing solution formed by mixing the disclosed chemical polishing solutions with colloidal silica. Moreover, it should be noted that all such combinations of processes are encompassed within the present disclosure.

The disclosed chemical polishing solutions and methods may make it possible to improve wafer quality, decrease cost, and/or reduce associated environmental pollution.

For further illustration of various aspects of the present disclosure, several specific examples will now be described. It should be understood however that these examples are for illustrative purposes only, and are not intended to limit the scope of the present disclosure.

EXAMPLES

Examples 1-3

The components of the chemical polishing solutions are provided according to the formulations provided in Table 1 (with numerical values based on the total weight of the chemical components). These formulations may be uniformly mixed with deionized water (with concentration being based on the total weight of the resulting solution), thus producing the chemical polishing solutions. 10 L of each fresh chemical polishing solution was stored in a 20 L sealed container for 24 hours. The $Cl_2$ concentration in the air space of each container may be measured using a chlorine-methyl orange spectrophotometric method. The results for the three solutions show that $Cl_2$ vaporizes into the air space in each container is less than 55.3 ml/m$^3$ (calculated as under a normal condition). These values confirm that the disclosed chemical polishing solutions are stable and may be used within 24 hours after their preparation without negative effect.

The disclosed chemical polishing solutions formulated within 24 hours may be used to carry out the chemical polishing of 150.04 mm (6 inch) diameter, 710 μm thick GaAs wafers in the single-sided polishing equipment of FIG. 1. The wafers are loaded as shown in FIG. 1, 4 pieces in a batch, and undergo chemical polishing for 6 minutes, with the lower polishing plate and the polishing head rotating in the same direction at 30 rpm. The wafers are taken out, cleaned with deionized water, dried, and subjected to further measurement.

Measurement Data/Information:

1. Elements on the surfaces of the wafers may be measured by TXRF (TREX610, Technos, OSAKA, Japan) and no Cu was measured on the wafers' surfaces (marked with √ in Table 1).

2. Surface roughness of the polished wafers, Ra, may be measured by AFM (atomic force microscopy) and Ra of less than 1 Å was acceptable (marked with √ in Table 1).

3. Yield may be expressed as the ratio of the acceptable products after one polishing process, and a yield of no lower than 90% was judged as acceptable (marked with √ in Table 1).

4. Flatness data, TTV (Total Thickness Variation) <7 μm, WARP (warp of the wafer) <10 μm, and Bow (bend of wafer) <5 μm, may be judged as acceptable (marked with √ in Table 1).

5. Removal rate may be expressed as the removal amount of the wafer (the difference of the thicknesses of the wafer before and after the polishing) divided by the time of polishing.

6. The wafer thickness data may be collected with a contact thickness gauge, ID-C125EB, MIPUTOYO, Japan, and analyzed by software, Minitab Special-6 Sigma analysis software, and also analyzed by histogram analysis method. The histogram may be used to check the distribution of the data of the samples, which are simulated to constitute a smooth curve of distribution. The ordinate of the histogram represents the number of samples, referred to as number, on the respective abscissa. The results of the above items are shown below in Table 1.

TABLE 1

Compositions of Chemical Polishing Solutions and Experiment Results

| Chemical components | Example 1 | Example 2 | Example 3 |
|---|---|---|---|
| Sodium dichloroisocyanurate | 30.1% | 32.4% | 35.2% |
| Sodium acid pyrophosphate | 34.8% | 28.5% | 24.8% |
| Sodium carbonate | 15.5% | 18.2% | 21.6% |
| Sodium bicarbonate | 19.2% | 20.6% | 18.0% |
| Sodium sulfonate | 0.4% | 0.3% | 0.4% |
| concentration of Chemical components (wt. %) | 1.8 | 0.5 | 1.1 |
| TXRF | ✓ | ✓ | ✓ |
| AFM | ✓ | ✓ | ✓ |
| Yield | ✓ | ✓ | ✓ |
| Flatness | ✓ | ✓ | ✓ |
| Removal (μm/min) | 0.96 | 0.68 | 1.09 |

Figure 2:
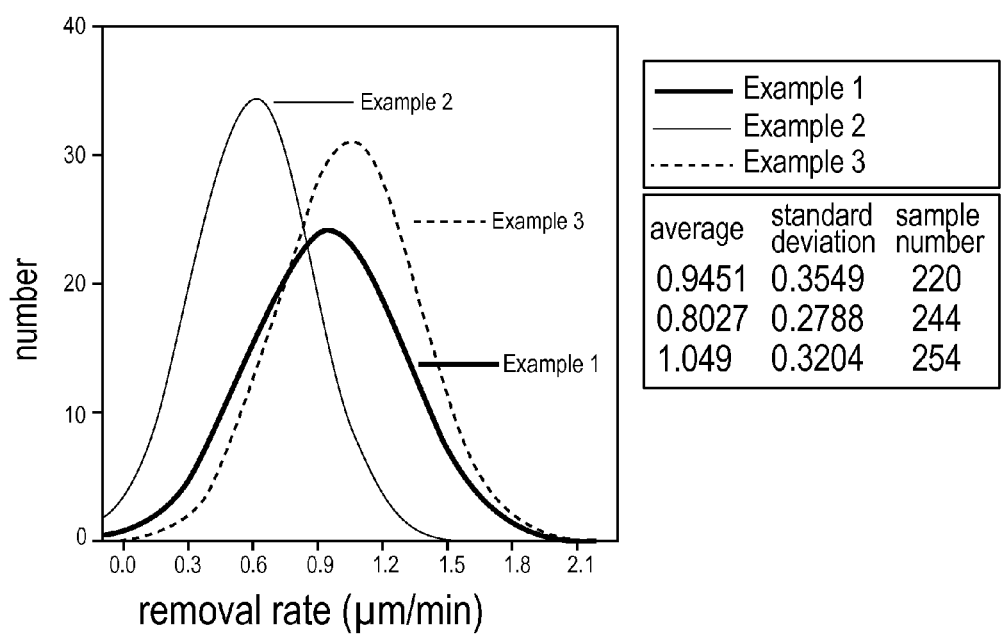
FIG. 2 illustrates the removal rate distribution in Examples 1, 2 and 3 as provided herein with different chemical polishing solutions consistent with certain aspects of the innovations herein.

Removal data are shown in FIG. 2, wherein the "average, standard deviation and sample number (sample numbers used in examples)", from above to below, are for Examples 1 to 3 respectively.

7. The flatness data of the wafers, including the data of WARP and BOW, may be collected by an Ultrosort instrument, Tropel, and analyzed by software, Minitab Special-6 Sigma analysis software, and also analyzed by histogram analysis method. The histogram may be used to check the distribution of the data of the samples, which are simulated to constitute a smooth curve of distribution. The ordinate of the histogram represented the number of samples, referred to as number, on the respective abscissa.

Figure 3:
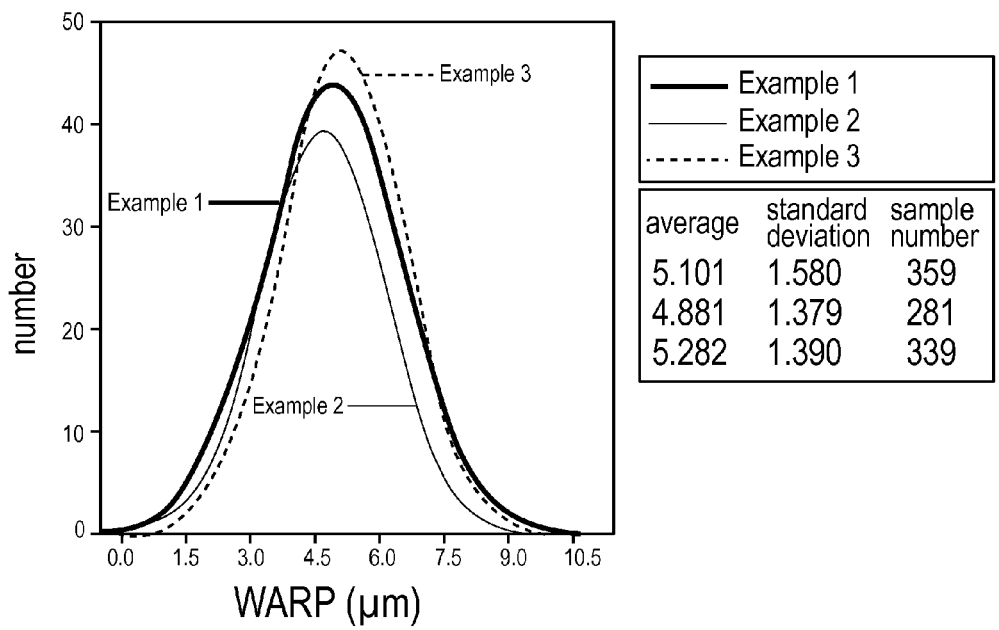
FIG. 3 illustrates the warp distribution in Examples 1, 2 and 3 as provided herein with different chemical polishing solutions consistent with certain aspects of the innovations herein.
Figure 4:
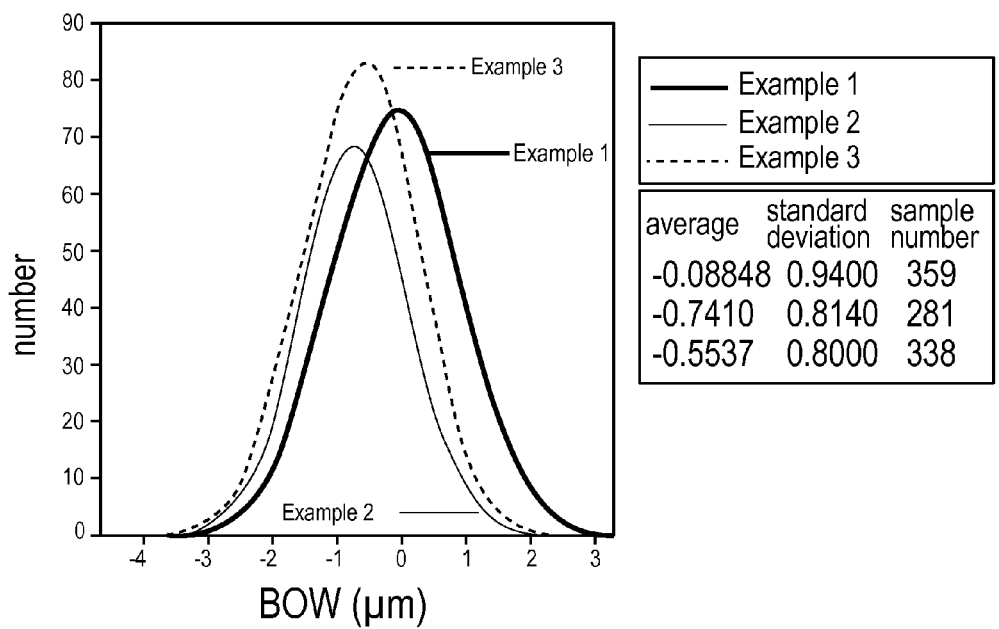
FIG. 4 illustrates the BOW distribution in Examples 1, 2 and 3 as provided herein with different chemical polishing solutions consistent with certain aspects of the innovations herein.

Analysis results are shown in FIGS. 3-4, wherein the abscissa represent BOW or WARP, and the "average, standard deviation and sample number (sample numbers used in examples)", from above to below, were for examples 1 to 3 respectively.

While the present disclosure has been particularly shown and described with reference to several implementations thereof, it will be understood by those of ordinary skill in the art that various changes in form and details may be made thereto without departing from the principles and spirit of the present disclosure, the proper scope of which is defined in the following claims and their equivalents.

What is claimed is:

1. A chemical polishing solution for chemical polishing gallium arsenide (GaAs) wafers comprising about 35.2% of an alkali metal dichloroisocyanurate or ammonium dichloroisocyanurate, about 24.8% of an alkali metal acid pyrophosphate or ammonium pyrophosphate, about 21.6% of an alkali metal carbonate or ammonium carbonate, about 18.0% of an alkali metal bicarbonate or ammonium bicarbonate, and about 0.4% of an alkali metal sulfonate or ammonium sulfonate, based on a total weight of 100%, excluding any solvents.

2. The chemical polishing solution of claim 1, wherein the total percentage by weight of the alkali metal dichloroisocyanurate or ammonium dichloroisocyanurate, the alkali metal acid pyrophosphate or ammonium pyrophosphate, the alkali metal carbonate or ammonium carbonate, the alkali metal bicarbonate or ammonium bicarbonate, and the alkali metal sulfonate or ammonium sulfonate, is not higher than about 2% of the total weight of the solution.

3. The chemical polishing solution of claim 1, wherein the alkali metal dichloroisocyanurate is sodium dichloroisocyanurate or potassium dichloroisocyanurate, the alkali metal acid pyrophosphate is sodium acid pyrophosphate or potassium acid pyrophosphate, the alkali metal carbonate is sodium carbonate or potassium carbonate, the alkali metal bicarbonate is sodium bicarbonate or potassium carbonate, and the alkali metal sulfonate is sodium sulfonate or potassium sulfonate.

4. The chemical polishing solution of claim 3, wherein the alkali metal dichloroisocyanurate is sodium dichloroisocyanurate, the alkali metal acid pyrophosphate is sodium acid pyrophosphate, the alkali metal carbonate is sodium carbonate, the alkali metal bicarbonate is sodium bicarbonate, and the alkali metal sulfonate is sodium sulfonate.

5. The chemical polishing solution of claim 1, further comprising one or more solvents.

6. The chemical polishing solution of claim 5, wherein the one or more solvents is an aqueous solvent, an alcoholic solvent, ketone solvent, ether solvent or a halogenated solvent.

7. The chemical polishing solution of claim 6, wherein the one or more solvents is water.

8. The chemical polishing solution of claim 5, wherein the one or more solvents is water.

9. A chemical polishing method for performing chemical polishing of a gallium arsenide (GaAs) crystal wafer, comprising:
polishing the wafer in a chemical polishing apparatus in the presence of the chemical polishing solution comprising about 35.2% of an alkali metal dichloroisocyanurate or ammonium dichloroisocyanurate, about 24.8% of an alkali metal acid pyrophosphate or ammonium pyrophosphate, about 21.6% of an alkali metal carbonate or ammonium carbonate, about 18.0% of an alkali metal bicarbonate or ammonium bicarbonate, and about 0.4% of an alkali metal sulfonate or ammonium sulfonate, based on a total weight of 100%, excluding any solvents.

10. The method of claim 9, wherein the chemical polishing solution further comprising one or more solvents.

11. The chemical polishing method of claim 9, wherein the total percentage by weight of the alkali metal dichloroisocyanurate or ammonium dichloroisocyanurate, the alkali metal acid pyrophosphate or ammonium pyrophosphate, the alkali metal carbonate or ammonium carbonate, the alkali metal bicarbonate or ammonium bicarbonate, and the alkali metal sulfonate or ammonium sulfonate, is not higher than about 2% of the total weight of the solution.

12. The chemical polishing method of claim 9, wherein the alkali metal dichloroisocyanurate is sodium dichloroisocyanurate or potassium dichloroisocyanurate, the alkali metal acid pyrophosphate is sodium acid pyrophosphate or potassium acid pyrophosphate, the alkali metal carbonate is sodium carbonate or potassium carbonate, the alkali metal bicarbonate is sodium bicarbonate or potassium carbonate, and the alkali metal sulfonate is sodium sulfonate or potassium sulfonate.

13. The chemical polishing method of claim 12, wherein the alkali metal dichloroisocyanurate is sodium dichloroisocyanurate, the alkali metal acid pyrophosphate is sodium acid pyrophosphate, the alkali metal carbonate is sodium carbonate, the alkali metal bicarbonate is sodium bicarbonate, and the alkali metal sulfonate is sodium sulfonate.

14. The chemical polishing method of claim 10, wherein the one or more solvents is an aqueous solvent, an alcoholic solvent, ketone solvent, ether solvent or a halogenated solvent.

15. The chemical polishing method of claim 10, wherein the one or more solvents is water.

16. The chemical polishing method of claim 14, wherein the one or more solvents is water.

17. A system for chemical-mechanical polishing of GaAs crystal wafers, the system comprising:
a platform for holding a GaAs wafer;
a polishing pad to contact the wafer; and
a chemical polishing solution comprising about 35.2% of an alkali metal dichloroisocyanurate or ammonium dichloroisocyanurate, about 24.8% of an alkali metal acid pyrophosphate or ammonium pyrophosphate, about 21.6% of an alkali metal carbonate or ammonium carbonate, about 18.0% of an alkali metal bicarbonate or ammonium bicarbonate, and about 0.4% of an alkali metal sulfonate or ammonium sulfonate, based on a total weight of 100%, excluding any solvents.

18. The system of claim 17, wherein the total percentage by weight of the alkali metal dichloroisocyanurate or ammonium dichloroisocyanurate, the alkali metal acid pyrophosphate or ammonium pyrophosphate, the alkali metal carbonate or ammonium carbonate, the alkali metal bicarbonate or ammonium bicarbonate, and the alkali metal sulfonate or ammonium sulfonate, is not higher than about 2% of the total weight of the solution.

19. The system of claim 17, wherein the alkali metal dichloroisocyanurate is sodium dichloroisocyanurate or potassium dichloroisocyanurate, the alkali metal acid pyrophosphate is sodium acid pyrophosphate or potassium acid pyrophosphate, the alkali metal carbonate is sodium carbonate or potassium carbonate, the alkali metal bicarbonate is sodium bicarbonate or potassium carbonate, and the alkali metal sulfonate is sodium sulfonate or potassium sulfonate.

20. The system of claim 19, wherein the alkali metal dichloroisocyanurate is sodium dichloroisocyanurate, the alkali metal acid pyrophosphate is sodium acid pyrophosphate, the alkali metal carbonate is sodium carbonate, the alkali metal bicarbonate is sodium bicarbonate, and the alkali metal sulfonate is sodium sulfonate.

* * * * *